(12) United States Patent
Deng et al.

(10) Patent No.: US 10,134,625 B2
(45) Date of Patent: Nov. 20, 2018

(54) SHALLOW TRENCH ISOLATION STRUCTURE AND FABRICATING METHOD THEREOF

(71) Applicants: Semiconductor Manufacturing International (Beijing) Corporation, Beijing (CN); Semiconductor Manufacturing International (Shanghai) Corporation, Shanghai (CN)

(72) Inventors: Hao Deng, Shanghai (CN); Yan Yan, Shanghai (CN); Jun Yang, Shanghai (CN); Tingting Peng, Shanghai (CN)

(73) Assignees: SEMICONDUCTOR MANUFACTURING INTERNATIONAL (BEIJING) CORPORATION, Beijing (CN); SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 15/249,205

(22) Filed: Aug. 26, 2016

(65) Prior Publication Data
US 2017/0062266 A1    Mar. 2, 2017

(30) Foreign Application Priority Data

Aug. 28, 2015  (CN) .......................... 2015 1 0543291

(51) Int. Cl.
*H01L 21/762* (2006.01)
*H01L 21/02* (2006.01)
*H01L 21/311* (2006.01)

(52) U.S. Cl.
CPC .... *H01L 21/76224* (2013.01); *H01L 21/0206* (2013.01); *H01L 21/02164* (2013.01);
(Continued)

(58) Field of Classification Search
None
See application file for complete search history.

(56) References Cited

U.S. PATENT DOCUMENTS 6,406,640 B1 *   6/2002  Yang ................. H01L 21/31116
                                                         216/67
2008/0274370 A1 * 11/2008  Sugawara ........... H01L 21/3105
                                                         428/650

(Continued)

*Primary Examiner* — Asok K Sarkar
(74) *Attorney, Agent, or Firm* — Anova Law Group PLLC

(57) ABSTRACT

In accordance with various embodiments of the disclosed subject matter, a shallow trench isolation structure and a fabricating method thereof are provided. The method for forming the shallow trench isolation structure may include: providing a semiconductor substrate; forming a shallow trench in the semiconductor substrate; forming a first insulating layer on a surface of the semiconductor substrate and in the shallow trench, a portion of the first insulating layer in the shallow trench includes an opening; etching the first insulating layer to increase a width of the opening; after etching the first insulating layer, performing a plasma treatment to an exposed surface of the first insulating layer; after the plasma treatment, cleaning the surface of the first insulating layer; and after cleaning the surface of the first insulating layer, filling a second insulating layer into the shallow trench.

20 Claims, 6 Drawing Sheets

(52) U.S. Cl.
CPC .. *H01L 21/02208* (2013.01); *H01L 21/02271* (2013.01); *H01L 21/31116* (2013.01)

(56) References Cited

U.S. PATENT DOCUMENTS

2011/0300700 A1* 12/2011 Kim .................. H01L 21/76224
    438/589
2016/0322328 A1* 11/2016 Tong .................. H01L 21/0206

\* cited by examiner

SHALLOW TRENCH ISOLATION STRUCTURE AND FABRICATING METHOD THEREOF

CROSS-REFERENCES TO RELATED APPLICATIONS

This application claims the priority of Chinese patent application No. 201510543291.3, filed on Aug. 28, 2015, the entire content of which is incorporated herein by reference.

TECHNICAL FIELD

The present disclosure generally relates to the field of semiconductor technologies and, more particularly, relates to a shallow trench isolation structure, and a fabricating method thereof.

BACKGROUND

Shallow trench isolation (STI) structure is an important isolation structure for isolating devices in semiconductor device fabrication. A method for forming the shallow trench isolation structure may include providing a semiconductor substrate, forming a shallow trench in the semiconductor substrate, forming an insulating layer on the surface of the semiconductor substrate and in the shallow trench, using a chemical mechanical polishing process to remove the insulating layer on the surface of the semiconductor substrate, and forming a shallow trench isolation structure in the shallow trench.

The device size gets smaller and smaller as the continuous developing of the semiconductor technology. With the reducing of the width of the shallow trench isolation structure, the aspect ratio of the shallow trench for forming the shallow trench isolation structure may be increased continuously. During the process of forming the insulating layer, the insulating material may be accumulated easily along the surface of the sidewalls nearby the top of the shallow trench. Therefore, a thickness of a portion of the insulating film at the sidewalls of the top of the shallow trench may be larger than a thickness of another portion of the insulating film at the bottom of the shallow trench. When the insulating material is continually to be deposited, the portion of the insulating film on the top of the shallow trench may be closed in advance, which may result in gaps in the formed shallow trench isolation structures.

In order to eliminate the gaps during filling insulating material into a high aspect ratio shallow, a high aspect ratio deposition process (HARP) can be used to form an insulating layer to satisfy the filling requirement of the high aspect ratio shallow trenches. Specifically, tetraethyl orthosilicate (TEOS) and ozone ($O_3$) can be used as reactive gases during the HARP process for filling the high aspect ratio shallow trench.

However, as the aspect ratio of the shallow trench increasing, the performance of the shallow trench isolation structure forming by the existing fabricating process may not be satisfactorily acceptable.

BRIEF SUMMARY

In accordance with some embodiments of the disclosed subject matter, a shallow trench isolation structure, and a fabricating method thereof are provided.

The disclosed method for forming the shallow trench isolation structure can comprise: providing a semiconductor substrate; forming a shallow trench in the semiconductor substrate; forming a first insulating layer on a surface of the semiconductor substrate and in the shallow trench, a portion of the first insulating layer in the shallow trench includes an opening; etching the first insulating layer to increase a width of the opening; after etching the first insulating layer, performing a plasma treatment to an exposed surface of the first insulating layer; after the plasma treatment, cleaning the surface of the first insulating layer; and after cleaning the surface of the first insulating layer, filling a second insulating layer into the shallow trench.

In some embodiments, the plasma treatment includes using Ar gas, He gas, or a combination gas of Ar and He.

In some embodiments, a total gas flow rate of the plasma treatment is between 1000 sccm and 3000 sccm.

In some embodiments, a high frequency radio frequency (RF) power of the plasma treatment is between 100 W and 500 W; and a low frequency radio frequency (RF) power of the plasma treatment is between 50 W and 150 W.

In some embodiments, a chamber pressure of the plasma treatment is between 5 torr and 15 torr; a chamber temperature of the plasma treatment is between 350° C. and 450° C.; and a processing time of the plasma treatment is between 30 s and 90 s.

In some embodiments, the surface of the first insulating layer is cleaned by a hot deionized water.

In some embodiments, a material of the first insulating layer is silicon dioxide.

In some embodiments, a process for forming the first insulating layer is a high aspect ratio deposition process using tetraethyl orthosilicate and ozone as precursors.

In some embodiments, a flow rate of the tetraethyl orthosilicate is between 500 mg/min and 2500 mg/min; and a flow rate of the ozone is between 15000 sccm and 25000 sccm.

In some embodiments, a chamber pressure of the process for forming the first insulating layer is between 550 torr to 650 torr; and a chamber temperature of the process for forming the first insulating layer is between 450° C. and 600° C.

In some embodiments, a process for etching the first insulating layer is a dry etching process using $NH_3$, $NF_3$, He and Ar as etching gases.

In some embodiments, a flow rate of the $NH_3$ is between 50 sccm and 200 sccm; a flow rate of the $NF_3$ is between 50 sccm and 200 sccm; and a flow rate of the He is between 500 sccm and 2000 sccm; and a flow rate of the Ar is between 300 sccm and 600 sccm.

In some embodiments, a radio frequency power of the dry etching process is between 50 W and 150 W; and an etching chamber pressure of the dry etching process is between 3 torr and 8 torr.

In some embodiments, a material of the second insulating layer is silicon dioxide.

In some embodiments, a process for forming the second insulating layer is a high aspect ratio process using tetraethyl orthosilicate and ozone as precursors.

In some embodiments, a flow rate of the tetraethyl orthosilicate is between 500 mg/min and 2500 mg/min; and a flow rate of the ozone is between 15000 sccm and 25000 sccm.

In some embodiments, a chamber pressure of the process for forming the second insulating layer is between 550 torr and 650 torr; and a chamber temperature of the process for forming the second insulating layer is between 450° C. and 600° C.

In some embodiments, the method can further include: before forming the first insulating layer, forming an insulating space layer on sidewall and bottom of the shallow trench.

In some embodiments, an aspect ratio of the shallow trench is between 5:1 and 10:1.

In some embodiments, after the etching process, an aspect ratio of the opening is between 10:1 and 15:1.

Other aspects of the disclosed subject matter can be understood by those skilled in the art in light of the description, the claims, and the drawings of the present disclosure.

BRIEF DESCRIPTION OF THE DRAWINGS

Various objects, features, and advantages of the disclosed subject matter can be more fully appreciated with reference to the following detailed description of the disclosed subject matter when considered in connection with the following drawings, in which like reference numerals identify like elements. It should be noted that the following drawings are merely examples for illustrative purposes according to various disclosed embodiments and are not intended to limit the scope of the present disclosure.

DETAILED DESCRIPTION

Figure 1:
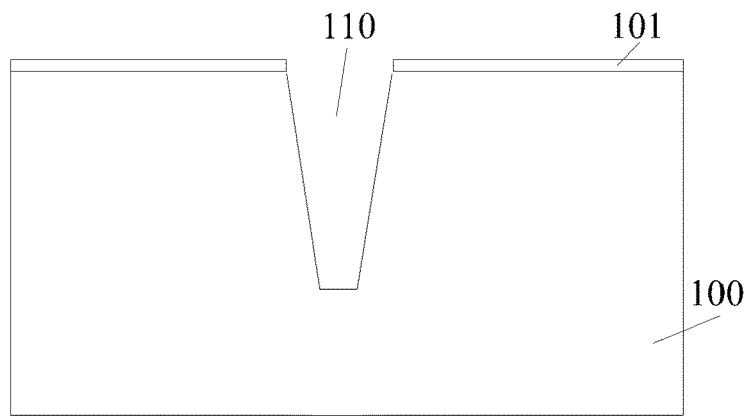
FIGS. 1-4 illustrate cross sectional structures of a shallow trench isolation structure corresponding to certain stages of an existing fabricating process.

Various objects, features, and advantages of the disclosed subject matter can be more fully appreciated with reference to the following detailed description of the disclosed subject matter when considered in connection with the following drawings, in which like reference numerals identify like elements. It should be noted that the following drawings are merely examples for illustrative purposes according to various disclosed embodiments and are not intended to limit the scope of one disclosure.

It is apparent that the described embodiments are some but not all of the embodiments of the present invention. Based on the disclosed embodiments, persons of ordinary skill in the art may derive other embodiments consistent with the present disclosure, all of which are within the scope of the present invention.

As mentioned in the background section, the performance of the shallow trench isolation structure forming by the existing fabricating process is not satisfactorily acceptable.

FIGS. 1-4 illustrate cross sectional structures of a shallow trench isolation structure corresponding to certain stages of an existing fabricating process.

Referring to FIG. 1, a semiconductor substrate 100 may be provided. A shallow trench 110 may be formed in the semiconductor substrate 100. A mask layer 101 may be formed on the top surface of the semiconductor substrate 100.

Figure 2:
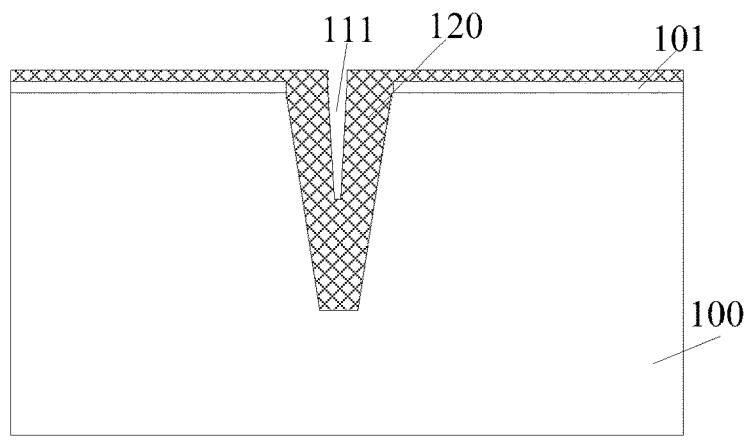

Referring to FIG. 2, a first insulating layer 120 may be formed on the surface of the semiconductor substrate 100 and in the shallow trench 110 as shown in FIG. 1. A portion of the first insulating layer 120 in the shallow trench 110 may include an opening 111.

A material of the first insulating layer 120 may be silicon dioxide.

Figure 3:
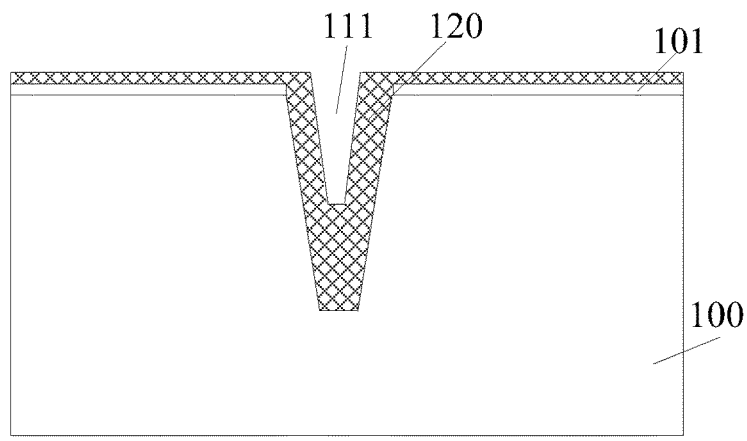

Referring to FIG. 3, the first insulating layer 120 may be etched to increase the width of the opening 111.

The gases used during the etching process to etch the first insulating layer 120 include $NF_3$, $NH_3$, He, and Ar.

Figure 4:
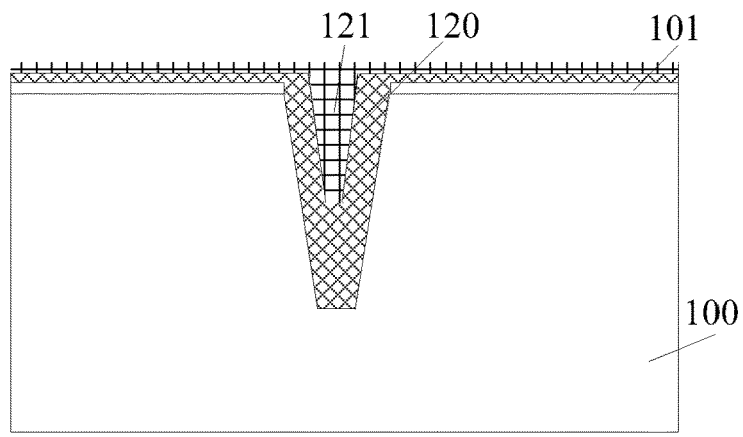

Referring to FIG. 4, after etching the first insulating layer 120, a second insulating layer 121 may be filled into the shallow trench 110.

During the etching process to increase the width of the opening of the first insulating layer, the etching gases may contain fluoride element. The etching gases and the first insulating layer may be interacted to create Si—F bonds on the surface of the first insulating layer. The Si—F bonds may not be uniformly distributed on the surface of the first insulating layer. Thus, the second insulating layer formed on the surface of the first insulating layer may have poor uniformity.

In another aspect, the etching gases and the first insulating layer may be interacted to form fluoride byproducts on the surface of the first insulating layer. The fluoride byproducts may accumulate in the opening of the first insulating layer, and thereby blocking the filling of the second insulating layer and forming pores. Thus, the second insulating layer may have a poor uniformity. Accordingly, the performance of the shallow trench isolation structure may be reduced.

Figure 13:
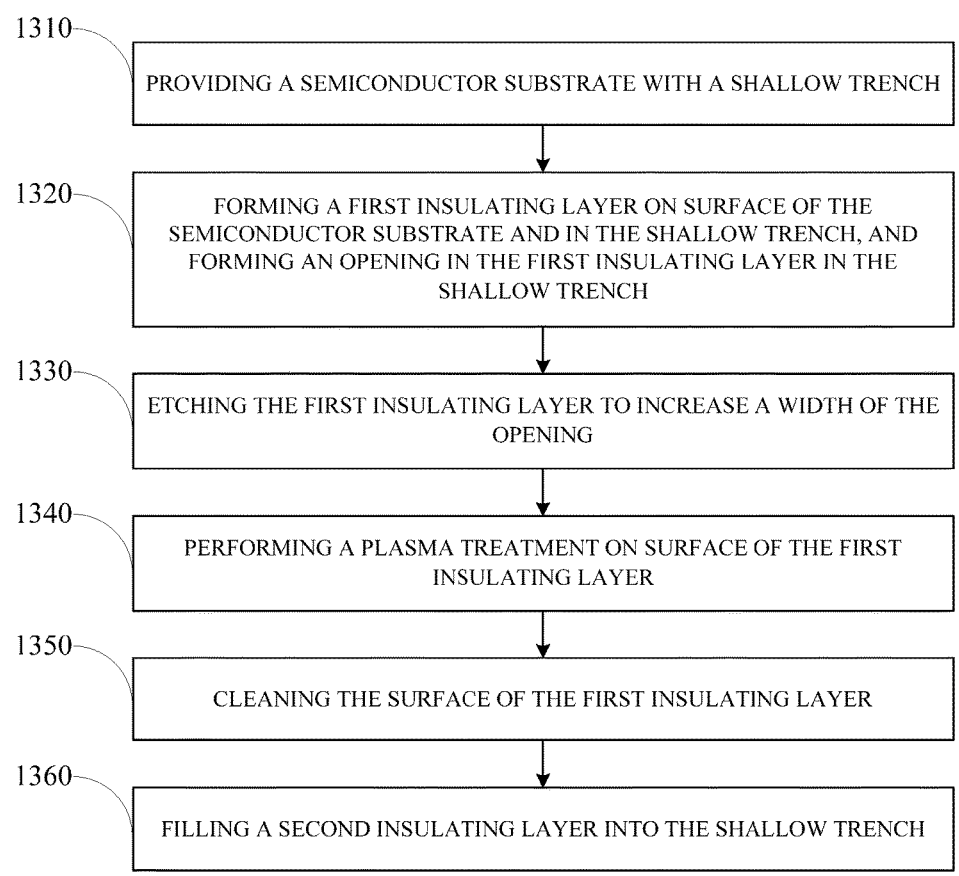
FIG. 13 illustrates a flow chart of an exemplary process for fabricating a shallow trench isolation structure in accordance with some embodiments of the disclosed subject matter.

Referring to FIG. 13, a flow chart of an exemplary process for fabricating a shallow trench isolation structure is shown in accordance with some embodiments of the disclosed subject matter.

The fabricating process may include the following steps: A semiconductor substrate with a shallow trench can be provided at step 1310. A first insulating layer may be formed on the surface of the semiconductor substrate and in the shallow trench at step 1320. An opening may be formed in the first insulating layer in the shallow trench. The first insulating layer may be etched to increase the width of the opening at step 1330. After the etching process, a plasma treatment may be applied on the surface of the first insulating layer at step 1340 to break the chemical bond formed through the interaction of the etching gases and the first insulating layer and to form residues on the surface of the first insulating layer. Then, the surface of the first insulating layer after the plasma treatment may be cleaned at 1350 to remove the residues and the byproducts formed through the interaction of the etching gases and the first insulating layer. After cleaning the surface of the first insulating layer, a second insulating layer may be filled into the shallow trench at step 1360. By using the disclosed method, the uniformity of the second insulating layer may be improved, and the performance of the shallow trench isolation structure may also be improved.

Referring to FIGS. 5-12, cross sectional structures of an exemplary shallow trench isolation structure corresponding to certain stages of the above disclosed fabricating process is shown in accordance with some embodiments of the disclosed subject matter.

Figure 5:
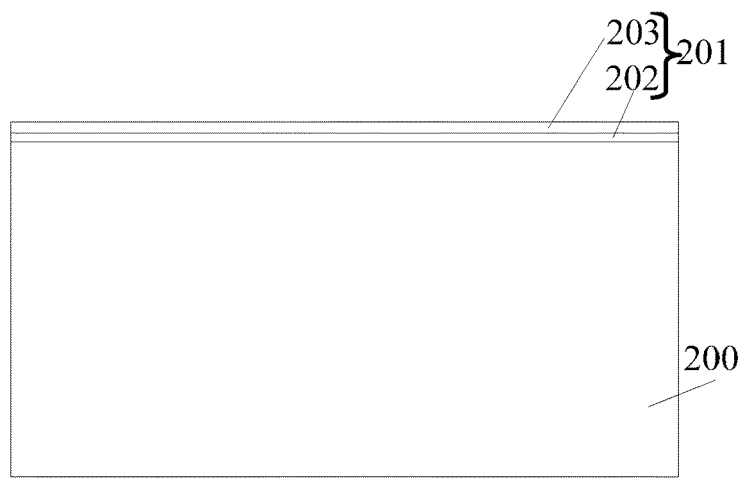
FIGS. 5-12 illustrate cross sectional structures of an exemplary shallow trench isolation structure corresponding to certain stages of an exemplary fabricating process consistent with some embodiments of the disclosed subject matter.

As illustrated in FIG. 5, a semiconductor substrate 200 may be provided.

The semiconductor substrate 200 may be used as a processing platform for forming a shallow trench isolation structure subsequently.

In some embodiments, a material of the semiconductor substrate 200 may be single crystal silicon, polysilicon or amorphous silicon. In some other embodiments, the material of the semiconductor substrate 200 may be silicon, germanium, silicon germanium, gallium arsenic, or any other suitable semiconductor materials. In one embodiment that will be described in the following as an example, the material for the semiconductor substrate 200 may be silicon.

In some embodiment, a mask layer 201 can be provided on the surface of the semiconductor substrate 200. The mask layer 201 may include an oxide layer 202 on the surface of the semiconductor substrate 200, and an etching barrier layer 203 on the surface of the oxide layer 202.

A material of the oxide layer 202 may be silicon dioxide. A thickness of the oxide layer may be between 20 Å and 100 Å. The oxide layer 202 may be formed by using a dry oxidation process or a wet oxidation process. The oxide layer 202 may be used as a buffer layer of an etching barrier layer 203 that can be formed in the subsequent steps.

Specifically, the oxide layer 202 may be formed between the semiconductor substrate 200 and the etching barrier layer 203 to avoid a large stress from the etching barrier layer 203 on the semiconductor substrate 200. Further, during an etching process for removing the etching barrier layer 203, the oxide layer 202 may be used as an isolation layer for protecting the active region from chemical contamination.

A material of the etching barrier layer 203 may be silicon nitride. A thickness of the etching barrier layer 203 may be 500 Å to 700 Å. A fabrication process of the etching barrier layer 203 may be a deposition process. The etching barrier layer 203 may be used as an etching stop layer to protect the active region during a subsequent chemical mechanical polishing process.

Figure 6:
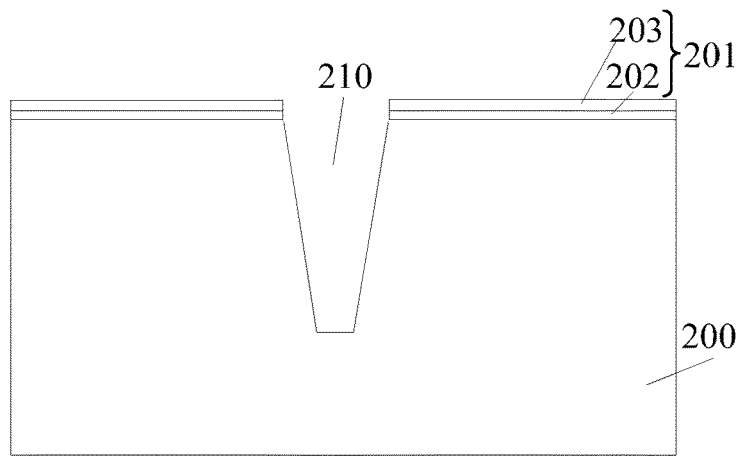

Referring to FIG. 6, a shallow trench 210 may be formed in the semiconductor substrate 200.

The shallow trench 210 may provide a space for filling the first insulating layer and the second insulating layer in the subsequent processes.

A process for forming the shallow trench 210 on the semiconductor substrate 200 may include the following steps: forming a mask layer 201 (as shown in FIG. 5) to cover the surface of the semiconductor substrate 200; forming a patterned photoresist layer for defining a location of the shallow trench 210 on the surface of the mask layer 201; using the patterned photoresist layer as a mask, etching the mask layer 201 and the semiconductor substrate 200 by using an anisotropic dry etching process.

Along with the continuous reduction of the critical size of the semiconductor devices gets, the aspect ratio of the shallow trench 210 for forming the shallow trench isolation structure are keeping increased. In some embodiments, the aspect ratio of the shallow trench may be 5:1 to 10:1.

A cross sectional shape of the shallow trench 210 may be a U-shape or a V-shape. In one embodiment, in order to facilitate the filling of the first insulating layer in the shallow trench 210, the cross sectional shape of the shallow trench 210 is a V-shape.

In some embodiments, the disclosed method further includes forming an insulating spacer layer (not shown in the Figures) on the sidewall and the bottom of the shallow trench 210. In some embodiments, a material of the insulating spacer layer may be silicon dioxide. A thickness of the insulating spacer layer may be between 30 Å and 200 Å. A fabrication process of the insulating spacer layer may be a deposition process, such as an atomic layer deposition process, a plasma enhanced chemical deposition process, or a thermal oxidation process.

The insulating spacer layer may be used as a buffer layer between the semiconductor substrate 200 and the first insulating layer formed in the subsequent processes. The insulating spacer layer may be used to provide a better binding quality between the first insulating layer and the semiconductor substrate 200. The insulating spacer layer may reduce the defects of the contacting surface between the first insulating layer and the semiconductor substrate 200.

Due to the relatively large aspect ratio of the shallow trench 210, it is difficult to fill insulating layer into the shallow trench 210. The insulating layer used to fill the shallow trench 210 may be hard to fully fill into the bottom portion of the shallow trench 210. The top portion of the shallow trench 210 may be easily filled by the insulating layer, and the shallow trench 210 may still have pores unfilled by the insulating layer. Therefore, in some embodiments, the first insulating layer may be filled into shallow trench 210 first. The first insulating layer in the shallow trench 210 may include an opening, so that the top portion of the shallow trench 210 may not be enclosed.

Figure 7:
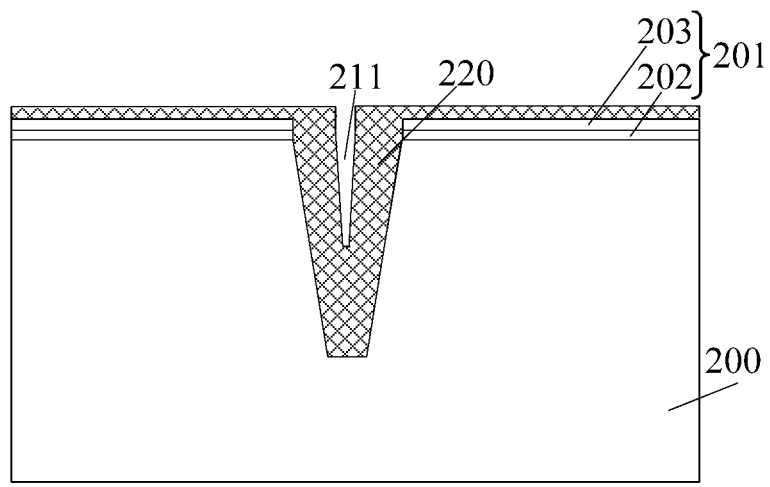

Referring to FIG. 7, the first insulating layer 220 may be formed on the surface of the semiconductor substrate 200 and in the shallow trench 210 (as shown in FIG. 6). The first insulating layer 220 in the shallow trench 210 may include the opening 211.

The first insulating layer 220 may be filled on the sidewalls and the bottom portion of the shallow trench 210 to make the top portion of the shallow trench 210 being non-enclosed.

In some embodiments, a material of the first insulating layer 220 may be silicon dioxide.

A process of forming the first insulating layer 220 may be a deposition process, such as a plasma enhanced chemical deposition process, a high density plasma enhanced chemical deposition process, a sub-atmospheric chemical vapor deposition process (SACVD), or a high aspect ratio deposition process (HARP). In one embodiment, the process of forming the first insulating layer 220 is a high aspect ratio deposition process (HARP).

In a specific example, the HARP process for forming the first insulating layer 220 may be operated in a SACVD machine. During the HARP process, tetraethyl orthosilicate (TEOS) and ozone ($O_3$) may be used as precursors. A flow rate of the TEOS may be between 500 mg/min and 2500 mg/min. A flow rate of the $O_3$ may be between 15000 sccm and 25000 sccm. A chamber pressure may be between 550 torr and 650 torr. A chamber temperature may be between 450° C. and 600° C.

The first insulating layer 220 may be filled into the shallow trench 210. The first insulating layer 220 may include opening 211 in the shallow trench 210, so that the top portion of the shallow trench 210 may be non-enclosed. The aspect ratio of the opening 211 may be larger than the aspect ratio of the shallow trench 210. Specifically, the aspect ratio of the opening 211 may be between 15:1 and 25:1.

The top of the shallow trench 210 may be enclosed and pores may be formed in the first insulating layer 220 when the first insulating layer 220 is continuously being filled into the shallow trench 210. Therefore, the first insulating layer 220 may be etched in the subsequent process to enlarge the width of the opening 211, which may facilitate the subsequent process for filling the second insulating layer into the shallow trench 210.

Figure 8:
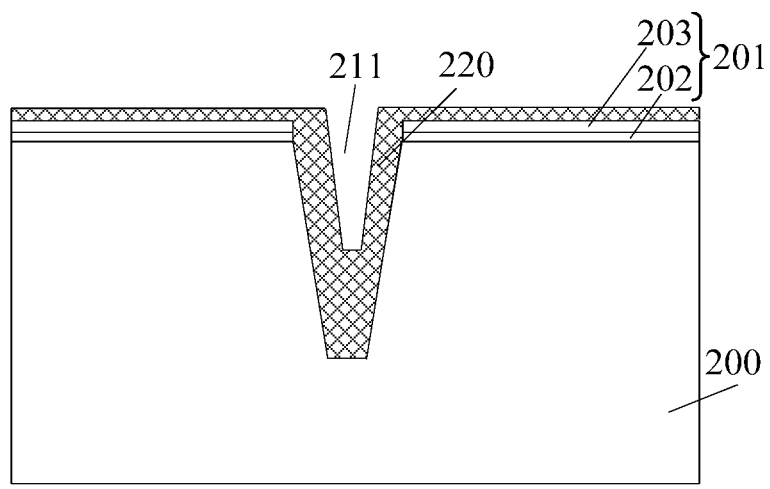

Referring to FIG. 8, the first insulating layer 220 may be etched to enlarge the width of the opening 211. A process for etching the first insulating layer 220 may be a dry etching process or a wet etching process.

In one embodiment, the process for etching the first insulating layer 220 is the dry etching process. During the dry etching process, $NH_3$, $NF_3$, He and Ar can be used as the etching gases. A flow rate of the $NH_3$ may be between 500 sccm and 2000 sccm. A flow rate of the $NF_3$ may be between 50 sccm and 200 sccm. A flow rate of the He may be between 500 sccm and 2000 sccm. A flow rate of the Ar may be between 300 sccm and 600 sccm. A radio frequency (RF) power may be between 50 W and 150 W. An etching chamber pressure may be between 3 torr and 8 torr.

Since the width of the opening 211 is increased, the aspect ratio of the opening 211 is decreased. Therefore, it can be easier to fill the second insulating layer into the shallow trench 210 in the subsequent process. In some embodiments, after etching the first insulating layer 220, the aspect ratio of the opening 211 may be between 10:1 and 15:1.

It should be noted that, during the etching process for etching the first insulating layer 220 to enlarge the width of the opening 211, the etching gases may contain fluoride element. In one aspect, the etching gases and the first insulating layer 220 may interact to form Si—F bonds on a partial surface of the first insulating layer 220. The Si—F bonds may affect the selectivity of the subsequent deposition of the second insulating layer on the surface the first insulating layer 220. In another aspect, the interaction of etching gases and the first insulating layer 220 may form byproducts containing fluoride element on a partial surface of the first insulating layer 220. The byproducts containing fluoride element may accumulate in the opening 211 to block the filling of the second insulating layer in the subsequent process. Therefore, a plasma treatment may be performed to the surface of the first insulating layer 220. And then the surface of the first insulating layer 220 may be cleaned. As such, the uniformity of the second insulating layer formed in the subsequent process can be improved.

Figure 9:
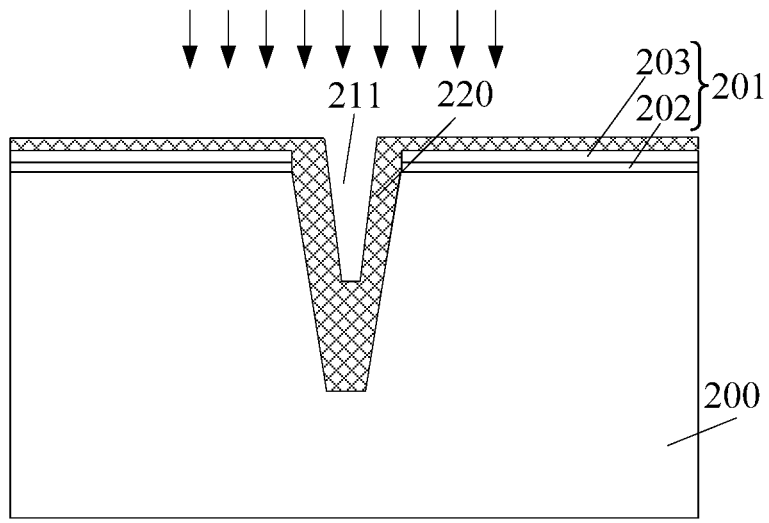

Referring to FIG. 9, after the etching process, the surface of the first insulating layer 220 may be processed with a plasma treatment, and then the surface of the first insulating layer 220 after the plasma treatment can be cleaned.

After the etching process, the surface of the first insulating layer 220 may be treated with plasma. The Si—F bonds formed on a partial surface of the first insulating layer 220 through the interaction of the etching gases and the first insulating layer 220 may be broken. Ionized residues can be formed on the surface of the first insulating layer 220. Then the surface of the first insulating layer 220 may be cleaned to remove the ionized residues. Additionally, during the cleaning process, the byproducts from on the surface of the first insulating layer 220 through the interaction of the etching gases and the first insulating layer 220 may also be removed. Therefore, the second insulating layer may be easily formed in the shallow trench 210 in the subsequent process. And, the second insulating layer on the surface of the first insulating layer 220 may have a good uniformity.

The gases used during the plasma treatment may include He, Ar, or a combination of He and Ar.

If a total flow rate of the gases used during the plasma treatment is low, a density of the generated plasmas may also be low. Thus the efficiency of the plasma treatment to the surface of the first insulating layer 220 may be limited. If the total flow rate of the gases of the plasma treatment is high, the cost of the fabrication process may also be high. Therefore, in some embodiments, the total flow rate of the gases during the plasma treatment may be between 1000 sccm and 3000 sccm.

The high frequency RF power of the plasma treatment may ionize the gases. If the high frequency RF power is too low, the gases may not be ionized. If the high frequency RF power is too high, the cost of fabrication process may also be higher. The high frequency RF power may be restricted by the fabrication process. Therefore, in some embodiments, the high frequency RF power during the plasma treatment may be between 100 W and 500 W.

The low frequency RF power may generate a bias voltage to accelerate the plasma to have a certain speed and to move towards the surface of the first insulating layer. If the low frequency RF power is too low, a kinetic energy of the plasma may be too low to break the Si—F bonds on the surface of the insulating layer 220. If the low frequency RF power is too high, the kinetic energy of the plasma may be too high to damage the surface of the first insulating layer 220. Therefore, in some embodiments, the low frequency RF power may be between 50 W and 150 W.

If a duration of the plasma treatment is too short, there may not be enough time to break the Si—F bonds on the surface of the first insulating layer 220. If the duration of the plasma treatment is too long, the surface of the first insulating layer 220 may be seriously damaged. Therefore, in some embodiments, the duration of the plasma treatment may be between 30 s and 90 s.

A chamber pressure of the plasma treatment may be between 5 torr and 15 torr. A chamber temperature of the plasma treatment may be between 350° C. and 450° C.

In some embodiments, the surface of the first insulating layer 220 may be cleaned by a hot deionized water.

Figure 10:
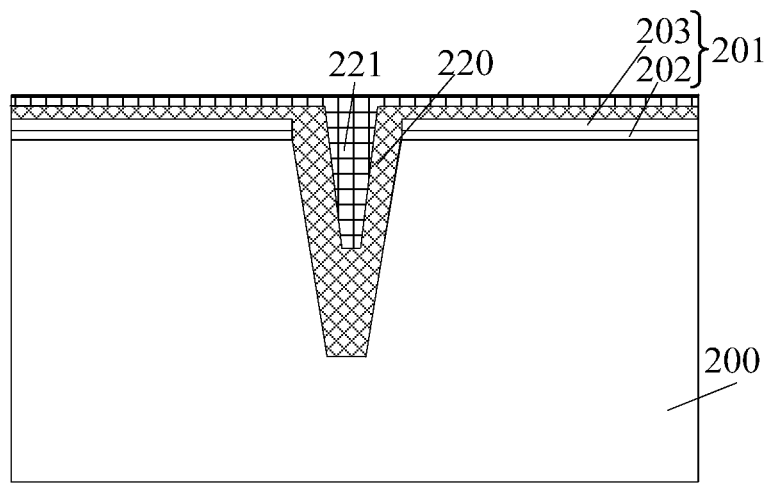

Referring to FIG. 10, after cleaning the surface of the first insulating layer 220, the second insulating layer 221 may be filled into the shallow trench 210.

In some embodiments, a material of the second insulating layer 221 may be silicon dioxide.

A process of forming the second insulating layer 221 may be a deposition process, such as a plasma enhanced chemical deposition process, a high density plasma enhanced chemical deposition process, a sub-atmospheric chemical vapor deposition process (SACVD), or a high aspect ratio deposition process (HARP). In one embodiment, the process of forming the second insulating layer 221 is a high aspect ratio deposition process (HARP).

In a specific example, the HARP process for forming the second insulating layer 221 may be operated in a SACVD machine. During the HARP process, tetraethyl orthosilicate (TEOS) and ozone ($O_3$) may be used as precursors. A flow rate of the TEOS may be between 500 mg/min and 2500 mg/min. A flow rate of the $O_3$ may be between 15000 sccm and 25000 sccm. A chamber pressure may be between 550 torr and 650 torr. A chamber temperature may be between 450° C. and 600° C.

Since the aspect ratio of the opening 211 is reduced after etching the first insulating layer 220, pores can be eliminated during the process for filling the second insulating layer 221. Additionally, the residues on the surface of the first insulating layer 220 may be removed after the plasma etching process. The byproducts formed on the surface of the first insulating layer 220 through the interaction of the etching gases and the first insulating layer 220 may also be removed. Thus, the uniformity of the second insulating layer 221 may be improved during the process for filling the second insulating layer 221 into the shallow trench 210.

Figure 11:
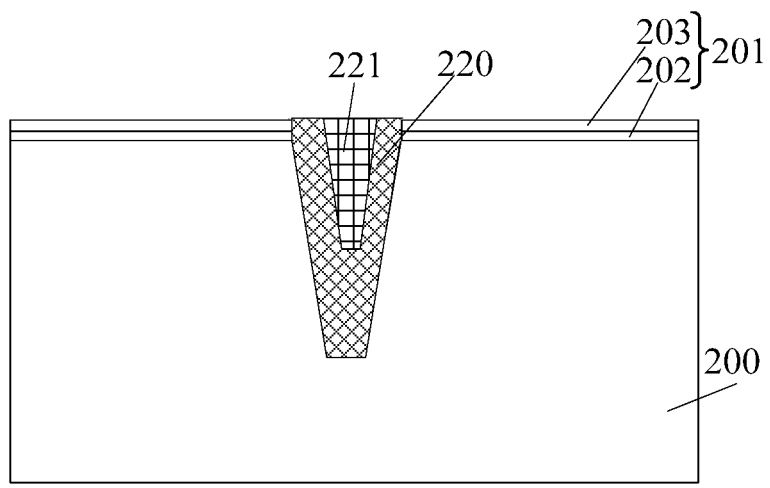

Referring to FIG. 11, the first insulating layer 220 and the second insulating layer 221 may be planarized until the surface of the mask layer 201 is exposed.

A process for planarizing the first insulating layer 220 and the second insulating layer 221 may be a chemical mechanical polishing (CMP) process.

The etching barrier layer 203 may be used as an etching stop layer during the planarizing process for preventing damages to the oxide layer 202 and the semiconductor substrate 200.

Figure 12:
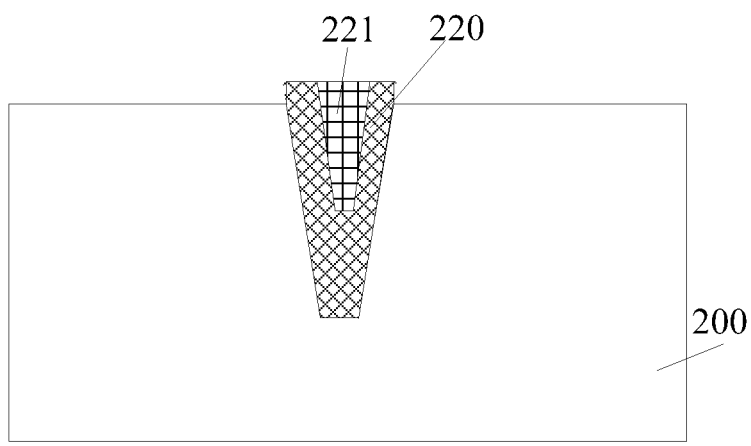

Referring to FIG. 12, the mask layer 201 (as shown in FIG. 11) may be removed by using a wet etching process to form the disclosed shallow trench isolation structure.

The provision of the examples described herein (as well as clauses phrased as "such as," "e.g.," "including," and the like) should not be interpreted as limiting the claimed subject matter to the specific examples; rather, the examples are intended to illustrate only some of many possible aspects.

Accordingly, a shallow trench isolation structure and a fabricating method thereof are provided.

Although the disclosed subject matter has been described and illustrated in the foregoing illustrative embodiments, it is understood that one disclosure has been made only by way of example, and that numerous changes in the details of embodiment of the disclosed subject matter can be made without departing from the spirit and scope of the disclosed subject matter, which is only limited by the claims which follow. Features of the disclosed embodiments can be combined and rearranged in various ways. Without departing from the spirit and scope of the disclosed subject matter, modifications, equivalents, or improvements to the disclosed subject matter are understandable to those skilled in the art and are intended to be encompassed within the scope of one disclosure.

What is claimed is:

1. A method for forming a shallow trench isolation structure, comprising:
   providing a semiconductor substrate;
   forming a shallow trench in the semiconductor substrate;
   forming a first insulating layer on a surface of the semiconductor substrate and in the shallow trench, a portion of the first insulating layer in the shallow trench includes an opening, wherein an aspect ratio of the opening is larger than an aspect ratio of the shallow trench;
   etching the first insulating layer to increase a width of the opening, the opening having a decreased aspect ratio;
   after etching the first insulating layer and before filling a second insulating layer into the opening, performing a plasma treatment on an exposed surface of the first insulating layer through the opening having the decreased aspect ratio, wherein:
   the plasma treatment uses a high frequency radio frequency (RF) power for ionizing Ar gas, He gas, or a combination gas of Ar and He, having a total gas flow rate between 1000 sccm and 3000 sccm to generate a plasma, and further uses a low frequency radio frequency (RF) power for generating a bias voltage to accelerate the plasma to move towards the exposed surface of the first insulation layer;
   after the plasma treatment, cleaning the surface of the first insulating layer; and
   after cleaning the surface of the first insulating layer, filling the second insulating layer into the opening.

2. The method of claim 1, wherein
the high frequency radio frequency (RF) power of the plasma treatment is between 100 W and 500 W, and
the low frequency radio frequency (RF) power of the plasma treatment is between 50 W and 150 W.

3. The method of claim 1, wherein:
a chamber pressure of the plasma treatment is between 5 torr and 15 torr;
a chamber temperature of the plasma treatment is between 350° C. and 450° C.; and
a processing time of the plasma treatment is between 30 s and 90 s.

4. The method of claim 1, wherein:
the surface of the first insulating layer is cleaned by a hot deionized water.

5. The method of claim 1, wherein:
a material of the first insulating layer is silicon dioxide.

6. The method of claim 5, wherein:
a process for forming the first insulating layer is a high aspect ratio deposition process using tetraethyl orthosilicate and ozone as precursors.

7. The method of claim 6, wherein:
a flow rate of the tetraethyl orthosilicate is between 500 mg/min and 2500 mg/min; and
a flow rate of the ozone is between 15000 sccm and 25000 sccm.

8. The method of claim 6, wherein:
a chamber pressure of the process for forming the first insulating layer is between 550 torr to 650 torr; and
a chamber temperature of the process for forming the first insulating layer is between 450° C. and 600° C.

9. The method of claim 1, wherein:
a process for etching the first insulating layer is a dry etching process using $NH_3$, $NF_3$, He and Ar as etching gases.

10. The method of claim 9, wherein:
a flow rate of the $NH_3$ is between 50 sccm and 200 sccm;
a flow rate of the $NF_3$ is between 50 sccm and 200 sccm;
a flow rate of the He is between 500 sccm and 2000 sccm; and
a flow rate of the Ar is between 300 sccm and 600 sccm.

11. The method of claim 10, wherein:
a radio frequency power of the dry etching process is between 50 W and 150 W; and
an etching chamber pressure of the dry etching process is between 3 torr and 8 torr.

12. The method of claim 1, wherein:
a material of the second insulating layer is silicon dioxide.

13. The method of claim 1, wherein:
a process for forming the second insulating layer is a high aspect ratio process using tetraethyl orthosilicate and ozone as precursors.

14. The method of claim 13, wherein:
a flow rate of the tetraethyl orthosilicate is between 500 mg/min and 2500 mg/min; and
a flow rate of the ozone is between 15000 sccm and 25000 sccm.

15. The method of claim 14, wherein:
a chamber pressure of the process for forming the second insulating layer is between 550 torr and 650 torr; and
a chamber temperature of the process for forming the second insulating layer is between 450° C. and 600° C.

16. The method of claim 1, further comprising:
before forming the first insulating layer, forming an insulating space layer on sidewall and bottom of the shallow trench.

17. The method of claim 1, wherein:
the aspect ratio of the shallow trench is between 5:1 and 10:1.

18. The method of claim 1, wherein:
after the etching process, the aspect ratio of the opening is between 10:1 and 15:1.

19. The method of claim 1, wherein forming the shallow trench in the semiconductor substrate comprises:
forming a mask layer on the semiconductor substrate before forming the shallow trench;
forming a patterned photoresist layer on the mask layer; and
using the patterned photoresist layer as an etch mask, etching the mask layer and the semiconductor substrate to form the shallow trench in the semiconductor substrate.

20. The method of claim 19, wherein the second insulating layer is further formed on the first insulating layer on the semiconductor substrate and the method further comprises:
planarizing the first insulating layer and the second insulating layer exposing a surface of the mask layer; and
removing the mask layer exposing the semiconductor substrate, wherein a top surface of the first insulating layer and a top surface of the second insulating layer are higher than the semiconductor substrate.

* * * * *